(12) United States Patent
Vaartstra

(10) Patent No.: US 6,730,163 B2
(45) Date of Patent: May 4, 2004

(54) ALUMINUM-CONTAINING MATERIAL AND ATOMIC LAYER DEPOSITION METHODS

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 218 days.

(21) Appl. No.: 10/099,624

(22) Filed: Mar. 14, 2002

(65) Prior Publication Data

US 2003/0176065 A1 Sep. 18, 2003

(51) Int. Cl.$^7$ ............................................... C30B 29/10
(52) U.S. Cl. ..................... 117/88; 117/102; 117/104; 117/105; 117/84; 117/950
(58) Field of Search .................. 117/84, 88, 102, 117/104, 105, 950

(56) References Cited

U.S. PATENT DOCUMENTS

| | | |
|---|---|---|
| 5,908,947 A | 6/1999 | Vaartstra |
| 6,287,965 B1 * | 9/2001 | Kang et al. ............... 438/648 |
| 6,391,803 B1 * | 5/2002 | Kim et al. ................ 438/787 |

FOREIGN PATENT DOCUMENTS

| | | | |
|---|---|---|---|
| WO | 2002027063 | * | 4/2002 |

OTHER PUBLICATIONS

Kim et al., "Compositional Variations of TiAlN films deposited by metalorganic atomic layer depsosition method", Jpn. J. Applied Physics, vol. 41 part 1 (2a) Feb. 2002 pp. 562–565.*

Sean T. Barry, et al., "Monomeric Chelated Amides of Aluminum and Gallium: Volatile, Miscible Liquid Precursors for CVD", Harvard University Chemical Laboratories, Mater. Res. Soc. Symp. Proc., 2000, vol. 606, p. 83.

* cited by examiner

Primary Examiner—Robert Kunemund
(74) Attorney, Agent, or Firm—Wells St. John P.S.

(57) ABSTRACT

An aluminum-containing material deposition method includes depositing a first precursor on a substrate in the substantial absence of a second precursor. The first precursor can contain a chelate of $Al(NR^1R^2)_x(NR^3(CH_2)_zNR^4R^5)_y$ or $Al(NR^1R^2)_x(NR^3(CH_2)_zOR^4)_y$; where x is 0, 1, or 2; y is 3–x; z is an integer 2 to 8; and $R_1$ to $R_5$ are independently selected from among hydrocarbyl groups containing 1 to 10 carbon atoms with silicon optionally substituted for one or more carbon atoms. The method includes depositing the second precursor on the first deposited precursor, the second precursor containing a nitrogen source or an oxidant. A deposition product of the first and second precursors includes at least one of an aluminum nitride or an aluminum oxide. The deposition method can be atomic layer deposition where the first and second precursors are chemisorbed or reacted as monolayers. The first precursor can further be non-pyrophoric.

29 Claims, 3 Drawing Sheets

US 6,730,163 B2

ALUMINUM-CONTAINING MATERIAL AND ATOMIC LAYER DEPOSITION METHODS

TECHNICAL FIELD

The invention pertains to atomic layer deposition methods.

BACKGROUND OF THE INVENTION

Atomic layer deposition (ALD) is recognized as a deposition technique that forms high quality materials with minimal defects and tight statistical process control. Even so, new deposition precursors are sought that may be particularly suited to ALD. ALD of aluminum nitride films has been accomplished with known precursors comprising aluminum alkyls, such as trimethyl aluminum, triethyl aluminum, and tributyl aluminum. However, the known precursors can be pyrophoric or require other special handling that complicates the ALD process.

Accordingly, a need exists for ALD precursors of aluminum-containing films that allow simplified processing.

SUMMARY OF THE INVENTION

According to one aspect of the invention, an aluminum-containing material deposition method includes depositing a first precursor on a substrate in the substantial absence of a second precursor, the first precursor exhibiting gas phase reactivity with the second precursor. The first precursor can contain a chelate of $Al(NR^1R^2)_x(NR^3(CH_2)_zNR^4R^5)_y$ or $Al(NR^1R^2)_x(NR^3(CH_2)_zOR^4)_y$; where x is 0, 1, or 2; y is 3–x; z is an integer from 2 to 8; and $R_1$ to $R_5$ are independently selected from among hydrocarbyl groups comprising 1 to 10 carbon atoms with silicon optionally substituted for one or more carbon atoms. The method includes depositing the second precursor on the first deposited precursor in the substantial absence of a non-deposited first precursor. The second precursor can contain at least one of a nitrogen source and an oxidant. A deposition product of the first and second precursors can contain at least one of an aluminum nitride or an aluminum oxide. As an example, depositing the first precursor can occur at a temperature of from about 100° C. to about 450° C.

In another aspect of the invention, an ALD method includes chemisorbing a first precursor on a substrate in the substantial absence of a second precursor. The first precursor can exhibit gas phase reactivity with the second precursor. The first precursor can contain a chelate of $Al(NR^1R^2)_x(NR^3(CH_2)_zNR^4R^5)_y$ or $Al(NR^1R^2)_x(NR^3(CH_2)_zOR^4)_y$; where x is 0,1, or 2; y is 3–x; z is an integer 2 to 8; and $R_1$ to $R_5$ are independently selected from among hydrocarbyl groups containing 1 to 10 carbon atoms with silicon optionally substituted for one or more carbon atoms. The method includes reacting the second precursor with the first chemisorbed precursor, the second precursor containing at least one of a nitrogen source and an oxidant. A reaction product of the first and second precursors includes at least one of an aluminum nitride or an aluminum oxide. As an example, the first precursor can be a liquid at a temperature of from about 20° C. to about 100° C. Also, the first precursor can be vaporized at a temperature of from about 25° C. to about 150° C. The first precursor can exhibit a vapor pressure of at least about 0.1 Torr at a temperature of from about 25° C. to about 150° C. The first precursor can exhibit a chemisorption rate of at least about 0.5 monolayers per second at $10^{-4}$ Torr with a solid surface comprising an oxide having hydroxyl groups on the oxide surface, platinum, rhodium, iridium, titanium, TiN, TaN, TaSiN, TiBN, or silicon. The first precursor can further be non-pyrophoric.

According to further aspect of the invention, an ALD method includes chemisorbing a first precursor on a substrate at a temperature of from about 150° C. to about 250° C. in the substantial absence of the second precursor. The first precursor can exhibit gas phase reactivity with the second precursor. The first precursor can contain the chelate described above where z is an integer from 2 to 4 and $R_1$ to $R_5$ are independently selected from among hydrocarbyl groups containing 1 to 5 carbon atoms with silicon optionally substituted for one or more carbon atoms. The method includes reacting the second precursor with the first chemisorbed precursor at substantially the same temperature. The second precursor can contain at least one of a nitrogen source and an oxidant. A reaction product of the first and second precursors can contain at least one of AlN or $Al_2O_3$.

According to a still further aspect of the invention, an ALD method includes chemisorbing a monolayer of a first precursor on a substrate at a temperature of from about 100° C. to about 400° C. in the substantial absence of a second precursor. The first precursor consists essentially of $Al(N(CH_3)_2)_2(N(CH_3)CH_2CH_2N(CH_3)_2)$ and the substrate contains at least one of metal oxide, platinum, titanium, and TiN. The first precursor is purged from over the substrate and a monolayer of a second precursor is reacted with the first chemisorbed precursor. The second precursor contains at least one of a nitrogen source and an oxidant. A reaction product of the first and second precursors contains at least one of AlN or $Al_2O_3$. The second precursor is purged from over the substrate and exposure and purging of the first and second precursors is successively repeated to form a capacitor dielectric layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
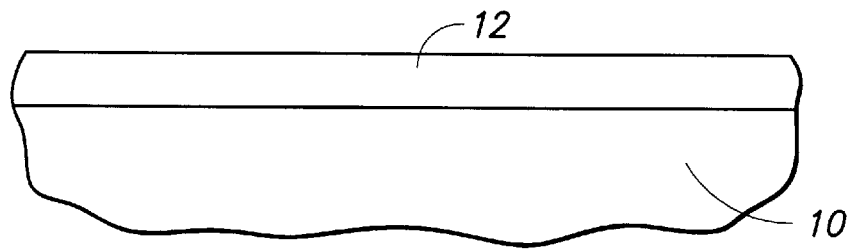
FIG. 1 is a partial sectional view of a capacitor construction at an intermediate process stage according to one aspect of the invention.

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), pulsed CVD, etc., but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Described in summary, ALD includes exposing an initial substrate to a first chemical specie to accomplish chemisorption of the specie onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first specie is purged from over the substrate and a second chemical specie is provided to react with the first monolayer of the first specie. The second specie is then purged and the steps are repeated with exposure of the second specie monolayer to the first specie. In some cases, the two monolayers may be of the same specie. As an option, the second specie can react with the first specie, but not chemisorb additional material thereto. That is, the second specie can cleave some portion of the chemisorbed first specie, altering such monolayer without forming another monolayer thereon. Also, a third specie or more may be successively chemisorbed (or reacted) and purged just as described for the first and second species.

Purging may involve a variety of techniques including, but not limited to, contacting the substrate and/or monolayer with a carrier gas and/or lowering pressure to below the deposition pressure to reduce the concentration of a specie contacting the substrate and/or chemisorbed specie. Examples of carrier gases include $N_2$, Ar, He, etc. Purging may instead include contacting the substrate and/or monolayer with any substance that allows chemisorption byproducts to desorb and reduces the concentration of a contacting specie preparatory to introducing another specie. The contacting specie may be reduced to some suitable concentration or partial pressure known to those skilled in the art based on the specifications for the product of a particular deposition process.

ALD is often described as a self-limiting process, in that a finite number of sites exist on a substrate to which the first specie may form chemical bonds. The second specie might only bond to the first specie and thus may also be self-limiting. Once all of the finite number of sites on a substrate are bonded with a first specie, the first specie will often not bond to other of the first specie already bonded with the substrate. However, process conditions can be varied in ALD to promote such bonding and render ALD not self-limiting. Accordingly, ALD may also encompass a specie forming other than one monolayer at a time by stacking of a specie, forming a layer more than one atom or molecule thick. The various aspects of the present invention described herein are applicable to any circumstance where ALD may be desired. A few examples of materials that may be deposited by ALD include aluminum nitride, aluminum oxide, and others.

Often, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition specie that chemisorbs to a substrate or reacts with a previously deposited specie. An ALD process regime may provide a simultaneously contacted plurality of species of a type or under conditions such that ALD chemisorption, rather than CVD reaction occurs. Instead of reacting together, the species may chemisorb to a substrate or previously deposited specie, providing a surface onto which subsequent species may next chemisorb or react to form a complete layer of desired material. Under most CVD conditions, deposition occurs largely independent of the composition or surface properties of an underlying substrate. By contrast, chemisorption rate in ALD might be influenced by the composition, crystalline structure, and other properties of a substrate or chemisorbed specie. Other process conditions, for example, pressure and temperature, may also influence chemisorption rate.

According to one aspect of the invention, an aluminum-containing material deposition method includes depositing a first precursor on a substrate in the substantial absence of a second precursor, the first precursor exhibiting gas phase reactivity with the second precursor. The first precursor can contain a chelate of $Al(NR^1R^2)_x(NR^3(CH_2)_zNR^4R^5)_y$ or $Al(NR^1R^2)_x(NR\ ^3(CH_2)_zOR^4)_y$; where x is 0, 1, or 2; y is 3–x; z is an integer from 2 to 8; and $R_1$ to $R_5$ are independently selected from among hydrocarbyl groups comprising 1 to 10 carbon atoms with silicon optionally substituted for one or more carbon atoms. The method includes depositing the second precursor on the first deposited precursor in the substantial absence of a non-deposited first precursor, the second precursor comprising at least one of a nitrogen source and an oxidant. A deposition product of the first and second precursors can contain at least one of an aluminum nitride or an aluminum oxide.

In another aspect of the invention, an ALD method includes chemisorbing a first precursor on a substrate in the substantial absence of a second precursor, the first precursor exhibiting the property of gas phase reactivity with the second precursor. The first precursor can include a chelate of $Al(NR^1R^2)_x(NR^3(CH_2)_zNR^4R^5)_y$ or $Al(NR^1R^2)_x(NR^3(CH_2)_zOR^4)_y$; where x is 0, 1, or 2; y is 3–x; z is an integer from 2 to 8; and $R_1$ to $R_5$ are independently selected from among hydrocarbyl groups comprising 1 to 10 carbon atoms with silicon optionally substituted for one or more carbon atoms. As an example, the hydrocarbyl groups can be alkyl, alkenyl, cycloalkyl, cycloalkenyl, or aryl with silicon optionally substituted for one or more carbon atoms. The ALD method further includes reacting the second precursor with the first chemisorbed precursor, the second precursor comprising at least one of a nitrogen source and an oxidant. A reaction product of the first and second precursors can include at least one of an aluminum nitride or an aluminum oxide.

The described method indicates the "substantial absence" of the second precursor during chemisorption of the first precursor since insignificant amounts of the second precursor might be present. According to the knowledge and the preferences of those with ordinary skill in the art, a determination can be made as to the tolerable amount of second precursor and process conditions selected to achieve the substantial absence of the second precursor.

In comparison to the predominantly thermally driven CVD, ALD is predominantly chemically driven. Accordingly, ALD is often conducted at much lower temperatures than CVD. In the various aspects of the invention described herein, chemisorbing the first precursor preferably occurs at a temperature of from about 100° C. to about 450° C. More preferably, chemisorbing the first precursor occurs at from about 100° C. to about 400° C., or most preferably at from about 150° C. to about 250° C. Surface reaction of the second precursor can occur at substantially the same temperature as chemisorption of the first precursor or, less preferably, at a substantially different temperature. Clearly, some small variation in temperature, as judged by those of ordinary skill, can occur but still be a substantially same temperature by providing a reaction rate statistically the same as would occur at the temperature of the first precursor chemisorption. Chemisorption and subsequent reactions could instead occur at exactly the same temperature.

Reactivity of a precursor can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, testing indicates that some compounds not suitable for CVD are superior ALD precursors. For example, the first precursor is described above as gas phase reactive with the second precursor. Such a precursor might not be suitable for CVD and it is thus surprising that the first precursor is particularly suitable for ALD. In the CVD context, concern might also exist regarding sticking coefficients and surface mobility, as known to those skilled in the art, when using the first precursor. Little or no such concern would exist in the ALD context when using the first precursor. U.S. Pat. No. 5,908,947 issued on Jun. 1, 1999 to the present inventor and assigned to Micron Technology, Inc. describes some CVD compounds discovered as problematic in CVD for the above reasons. U.S. Pat. No. 5,908,947 is herein incorporated by reference for its pertinent and supportive teachings. At least some of such CVD compounds are, however, suitable for ALD as uniquely described and shown herein.

Preferably, the first precursor described above exhibits a chemisorption rate of at least about 0.5 monolayers per second at $10^{-4}$ Torr with a solid surface comprising an oxide having hydroxyl groups on the oxide surface, platinum, rhodium, iridium, titanium, TiN, TaN, TaSiN, TiBN, or silicon. The chemisorbed first precursor fragment might also exhibit a reaction rate of at least about 1 monolayer per second at $10^{-4}$ Torr with ammonia vapor or $H_2O$ vapor. The substrate can comprise at least one of an oxide material and a metal element. More specifically, the substrate can comprise at least one of metal oxide, platinum, titanium, and TiN. Despite the composition of the substrate, the first precursor can accordingly exhibit a sufficiently high surface reactivity that chemisorption occurs at about the indicated rate or greater. The high surface reactivity allows shorter processing times and increases the saturation of chemisorbed monolayers.

It is further desirable that the first precursor exhibit an adequate volatility. Chemisorption of the first precursor on the substrate typically occurs by providing the first precursor in a gaseous form. A volatile first precursor can be easily provided in a gaseous form as feed material to an ALD reactor. Condensation within the reactor is less likely with a highly volatile precursor and any excess precursor not chemisorbed can be purged more easily from the reactor. In the various aspects of the invention described herein, the first precursor is preferably a liquid at a temperature of from about 20° C. to about 100° C. Also, the precursor can be vaporized at a temperature of from about 25° C. to about 150° C. Preferably, the first precursor exhibits a vapor pressure of at least about 0.1 Torr at a temperature of from about 25° C. to about 150° C.

The first precursor can additionally be non-pyrophoric. Pyrophoric precursors complicate handling requirements and are preferably avoided. The first precursor might be provided as a single species. It can optionally be mixed with a non-reactive carrier gas. In either case, the first precursor may also contain multiple different species. The preferred forms of the first precursor described above are those wherein z is an integer from 2 to 4. Further, $R_1$ to $R_5$ can be independently selected from among hydrocarbyl groups comprising 1 to 5 carbon atoms with silicon optionally substituted for one or more carbon atoms. The $(NR^3(CH_2)_zNR^4R^5)$ or $(NR^3(CH_2)_zOR^4)$ portion of the first precursor is a bidentate ligand or chelating agent that forms a chelate with the aluminum. Without chelation, the first precursor might tend to dimerize, potentially giving the material a higher melting point or lower volatility. The $(NR^1R^2)$ portion of the first precursor is a ligand also forming a coordinate covalent bond with the aluminum. Accordingly, for x=2, a four-coordinate complex is formed. Together, the chelating agent and additional ligand can present a variety of functional groups that assist in providing high reactivity for the first precursor. A most preferred precursor is $Al(N(CH_3)_2)_2(N(CH_3)CH_2CH_2N(CH_3)_2)$ where x is 2, y is 1, z is 2, and $R_1$ to $R_5$ are each methyl, also known as bis (dimethylamino) (N,N,N'-trimethylethylenediamino) aluminum. Such most preferred precursor is a highly volatile liquid at room temperatures, is highly reactive with a variety of surfaces, is non-pyrophoric allowing easy handling, and is reactive with various nitrogen sources (including ammonia and hydrazine) and various oxygen sources (including $H_2O$ and $O_3$). Surprisingly, the same compound is less preferred as a CVD compound, particularly for high step coverage, since it is gas phase reactive with ammonia, even at room temperatures.

The second precursor of the various aspects of the invention described herein can include at least one of $O_2$, $O_3$, $H_2O$, ammonia, hydrazine, alkyl-hydrazine compounds, and other hydrazine derivatives. Also, the reaction product of the first and second precursors can include AlN or $Al_2O_3$ or even consist of AlN or $Al_2O_3$.

According to another aspect of the invention, an atomic layer deposition method can include chemisorbing a first precursor on a substrate at a temperature of from about 150° C. to about 250° C. in the substantial absence of a second precursor. The first precursor can exhibit the property of gas phase reactivity with the second precursor. The first precursor can include a chelate of $Al(NR^1R^2)_x(NR^3(CH_2)_zNR^4R^5)_y$ or $Al(NR^1R^2)_x(NR^3(CH_2)_zOR^4)_y$; where x is 0, 1, or 2; y is 3−x; z is an integer from 2 to 4; and $R_1$ to $R_5$ are independently selected from among hydrocarbyl groups comprising 1 to 5 carbon atoms with silicon optionally substituted for one or more carbon atoms. The method also includes reacting the second precursor with the first chemisorbed precursor at substantially the same temperature. The second precursor can include at least one of a nitrogen source and an oxidant. A reaction product of the first and second precursors includes at least one of AlN or $Al_2O_3$.

In a further aspect of the invention, an atomic layer deposition method includes chemisorbing a monolayer of a first precursor on a substrate at a temperature of from about 100° C. to about 400° C. in the substantial absence of a second precursor. The first precursor consists essentially of $Al(N(CH_3)_2)_2(N(CH_3)CH_2CH_2N(CH_3)_2)$ and the substrate contains at least one of metal oxide, platinum, titanium, and TiN. The method includes purging the first precursor from over the substrate. A monolayer of the second precursor is reacted with the first chemisorbed precursor. The second precursor includes at least one of a nitrogen source and an oxidant. A reaction product of the first and second precursors includes at least one of AlN or $Al_2O_3$. The second precursor is purged from over the substrate and the method includes successively repeating exposure and purging of the first and second precursors to form a capacitor dielectric layer.

Figure 2:
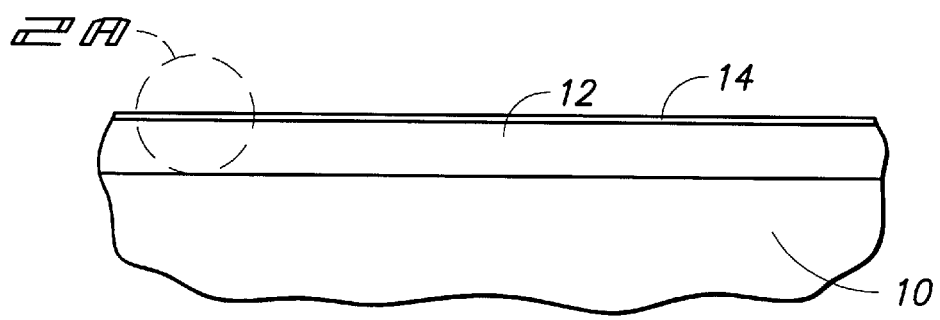
FIG. 2 is a partial sectional view of a capacitor construction at a process stage subsequent to that shown in FIG. 1.
Figure 2A:
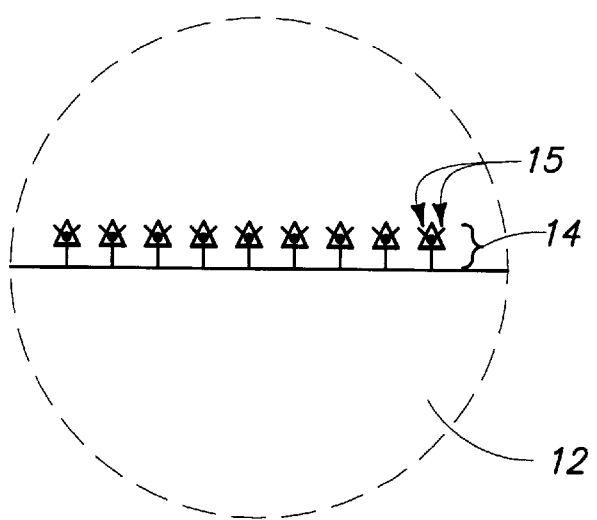
FIG. 2A is an enlarged view of a portion of the capacitor construction shown in FIG. 2.

FIG. 1 shows a partial cross-sectional view of substrate 10 having a bottom electrode 12 formed thereon. A first precursor is chemisorbed on bottom electrode 12 forming a first monolayer 14 as shown in FIG. 2. FIG. 2A shows an enlarged view of a portion of bottom electrode 12 and first monolayer 14 shown in FIG. 2. FIG. 2A shows in a graphical representation, not by way of limitation, individual molecules of the first precursor chemisorbed to bottom electrode 12. The individual molecules may have one or more reactive sites 15, depending on the particular precursor.

Figure 3:
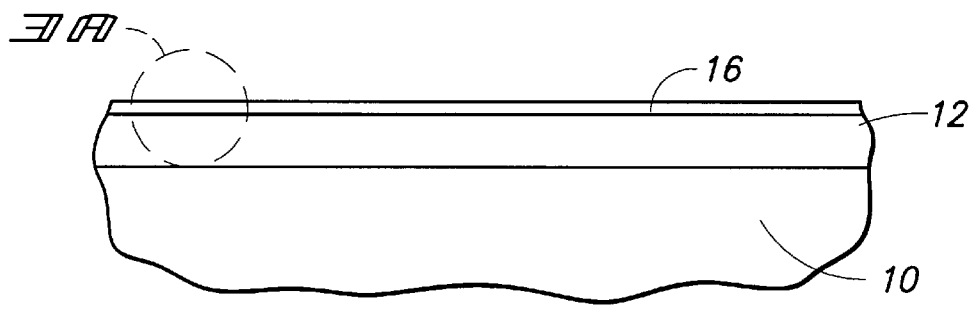
FIG. 3 is a partial sectional view of a capacitor construction at a process stage subsequent to that shown in FIG. 2.
Figure 3A:
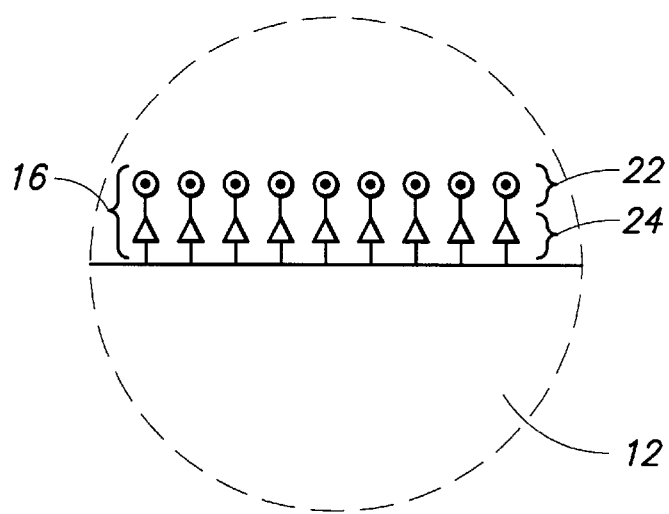
FIG. 3A is an enlarged view of a portion of the capacitor construction shown in FIG. 3.

A second precursor is reacted with the chemisorbed first precursor to form a product monolayer 16 on bottom electrode 12 as shown in FIG. 3. Product monolayer 16 is a reaction product of the first and second precursors. FIG. 3A shows in a graphical representation, not by way of limitation, individual molecules of the second precursor reacted and bonded to the chemisorbed first precursor molecules. Bonding may occur to first monolayer 14 at one or more of reactive sites 15. The reacted second precursor forms a second monolayer 22. Depending on the particular precursors, reaction of the second precursor with the chemisorbed first precursor can change the composition of individual molecules comprised by first monolayer 14. Accordingly, first monolayer 14 is represented in FIG. 3A as changed to a reacted first monolayer 24.

Although not shown graphically in the figures, the second precursor can merely react with the first precursor, but not chemisorb additional material to first monolayer 14. Such would be the case when the second precursor cleaves some portion of the chemisorbed first precursor leaving reacted first monolayer 24 without second monolayer 22 formed thereon. Reacted first monolayer 24 may thus form a completed product layer 16 or an additional precursor may be used to add material to reacted first monolayer 24, forming product layer 16.

Figure 4:
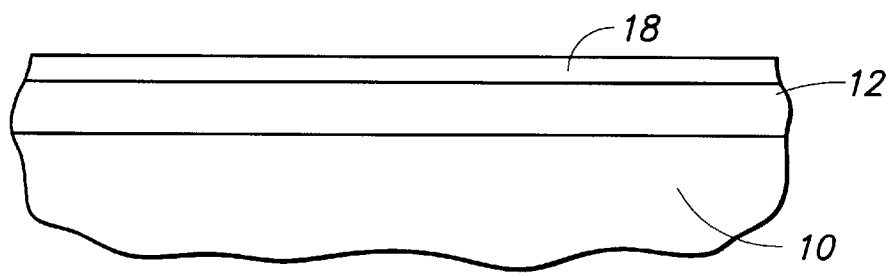
FIG. 4 is a partial sectional view of a capacitor construction at a process stage subsequent to that shown in FIG. 3.
Figure 5:
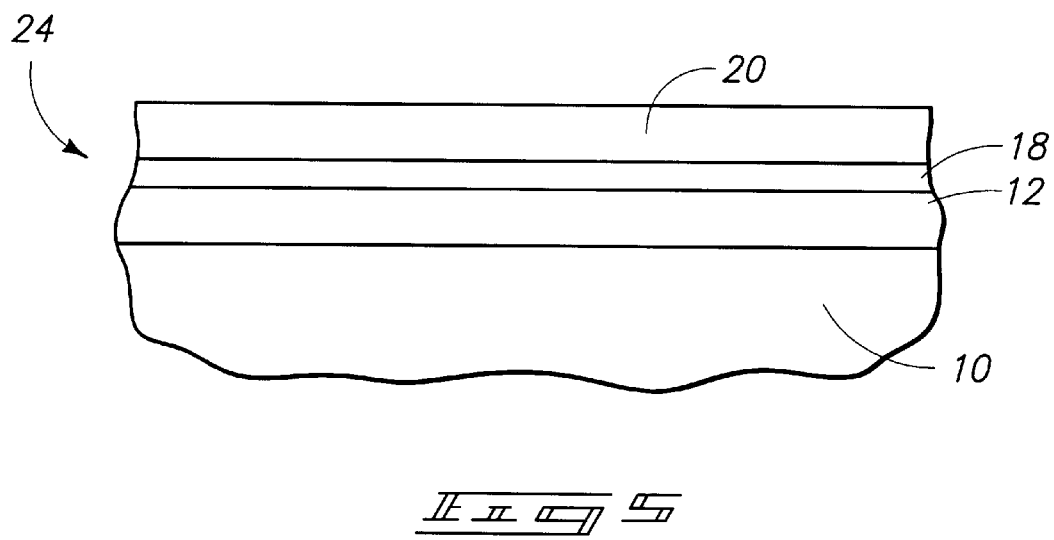
FIG. 5 is a partial sectional view of a capacitor construction at a process stage subsequent to that shown in FIG. 4.

Exposure of the first and second precursors can be repeated, forming successive first monolayers 14 and second monolayers 22 to provide a dielectric layer 18 as shown in FIG. 4. A top electrode 20 is formed over dielectric layer 18 creating a capacitor construction 24. Notably, the aspects of the invention described herein are applicable to a variety of capacitor designs in addition to the one shown in FIG. 5. The aspects of the invention are particularly valuable in forming very thin gate dielectrics, barriers, or dielectric layers in small geometries.

EXAMPLE

A reservoir was charged with bis (dimethylamino) (N,N, N'-trimethylethylenediamino) aluminum as a first precursor. The reservoir was connected to an ALD chamber, maintaining the reservoir temperature at about 50° C. and the valves and connection lines at about 60° C. A separate reservoir was charged with deionized $H_2O$ and maintained at ambient temperature. A silicon wafer having a bottom electrode of a capacitor formed thereon was placed in the ALD chamber and heated to about 250° C. for the ALD process.

The ALD process was run under dynamic vacuum (base pressure $10^{-4}$ Torr). The first precursor vapor was introduced using a 1 second pulse of a precursor valve and chemisorbed on the bottom electrode. A purge/pump step next used 50 standard $cm^3$/minute (sccm) of Ar purge for 1 second followed by 2 seconds of pump-down under vacuum. The $H_2O$ was next used as a reactant gas (second precursor) and reacted with the chemisorbed first precursor by flowing $O_2$ through the reservoir as a carrier (10 sccm) for an $O_2/H_2O$ vapor pulse of 1.5 seconds. After another purge/pump step, the process was repeated. A total of 100 cycles yielded about 80 Angstroms of $Al_2O_3$.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An aluminum-containing material deposition method comprising:

depositing a first precursor on a substrate in the substantial absence of a second precursor, the first precursor exhibiting gas phase reactivity with the second precursor, the first precursor comprising a chelate of $Al(NR^1R^2)_x(NR^3(CH_2)_zNR^4R^5)_y$ or $Al(NR^1R^2)_x(NR^3(CH_2)_zOR^4)_y$; where x is 0, 1, or 2; y is 3−x; z is an integer from 2 to 8; and $R_1$ to $R_5$ are independently selected from among hydrocarbyl groups comprising 1 to 10 carbon atoms with silicon optionally substituted for one or more carbon atoms; and depositing the second precursor on the first deposited precursor in the substantial absence of a non-deposited first precursor, the second precursor comprising at least one of a nitrogen source and an oxidant, and a deposition product of the first and second precursors comprising at least one of an aluminum nitride or an aluminum oxide.

2. The method of claim 1 wherein the deposition method comprises atomic layer deposition and the first and second precursors are deposited as monolayers.

3. The method of claim 1 wherein the first precursor consists essentially of $Al(N(CH_3)_2)_2(N(CH_3)CH_2CH_2N(CH_3)_2)$.

4. The method of claim 1 wherein depositing the first precursor occurs at a temperature of from about 100° C. to about 450° C.

5. An atomic layer deposition method comprising:
chemisorbing a first precursor on a substrate in the substantial absence of a second precursor, the first precursor exhibiting gas phase reactivity with the second precursor, the first precursor comprising a chelate of $Al(NR^1R^2)_x(NR^3(CH_2)_zNR^4R^5)_y$ or $Al(NR^1R^2)_x(NR^3(CH_2)_zOR^4)_y$; where x is 0, 1, or 2; y is 3−x; z is an integer from 2 to 8; and $R_1$ to $R_5$ are independently selected from among hydrocarbyl groups comprising 1 to 10 carbon atoms with silicon optionally substituted for one or more carbon atoms; and
reacting the second precursor with the first chemisorbed precursor, the second precursor comprising at least one of a nitrogen source and an oxidant, and a reaction product of the first and second precursors comprising at least one of an aluminum nitride or an aluminum oxide.

6. The method of claim 5 wherein the hydrocarbyl groups are selected from among alkyl, alkenyl, cycloalkyl, cycloalkenyl, or aryl with silicon optionally substituted for one or more carbon atoms.

7. The method of claim 5 wherein the first precursor is a liquid at a temperature of from about 20° C. to about 100° C.

8. The method of claim 5 wherein the first precursor is vaporized at a temperature of from about 25° C. to about 150° C.

9. The method of claim 5 wherein the first precursor exhibits a vapor pressure of at least about 0.1 Torr at a temperature of from about 25° C. to about 150° C.

10. The method of claim 5 wherein the first precursor exhibits a chemisorption rate of at least about 0.5 monolayers per second at $10^{-4}$ Torr with a solid surface comprising an oxide having hydroxyl groups on the oxide surface, platinum, rhodium, iridium, titanium, TiN, TaN, TaSiN, TiBN, or silicon.

11. The method of claim 5 wherein the first precursor is non-pyrophoric.

12. The method of claim 5 wherein the first precursor comprises a single species and is optionally mixed with a non-reactive carrier gas.

13. The method of claim 5 wherein the chemisorbed first precursor forms a monolayer.

14. The method of claim 5 wherein the substrate comprises at least one of an oxide material and a metal element.

15. The method of claim 5 wherein the substrate comprises at least one of metal oxide, platinum, titanium, and TiN.

16. The method of claim 5 wherein chemisorbing the first precursor occurs at a temperature of from about 100° C. to about 450° C.

17. The method of claim 5 wherein z is an integer from 2 to 4.

18. The method of claim 5 wherein $R_1$ to $R_5$ are independently selected from among hydrocarbyl groups comprising 1 to 5 carbon atoms with silicon optionally substituted for one or more carbon atoms.

19. The method of claim 5 wherein the second precursor comprises at least one of $O_2$, $O_3$, $H_2O$, ammonia, hydrazine, alkyl-hydrazine compounds, and other hydrazine derivatives.

20. The method of claim 5 wherein chemisorbing the second precursor occurs at substantially the same temperature as chemisorbing the first precursor.

21. The method of claim 5 wherein the chemisorption product comprises AlN or $Al_2O_3$.

22. An atomic layer deposition method comprising:
chemisorbing a first precursor on a substrate at a temperature of from about 150° C. to about 250° C. in the substantial absence of a second precursor, the first precursor exhibiting gas phase reactivity with the second precursor, the first precursor comprising a chelate of $Al(NR^1R^2)_x(NR^3(CH_2)_zNR^4R^5)_y$ or $Al(NR^1R^2)_x(NR^3(CH_2)_zOR^4)_y$; where x is 0, 1, or 2; y is 3−x; z is an integer from 2 to 4; and $R_1$ to $R_5$ are independently selected from among hydrocarbyl groups comprising 1 to 5 carbon atoms with silicon optionally substituted for one or more carbon atoms; and
reacting the second precursor with the first chemisorbed precursor at substantially the same temperature, the second precursor comprising at least one of a nitrogen source and an oxidant, and a reaction product of the first and second precursors comprising at least one of AlN or $Al_2O_3$.

23. The method of claim 22 wherein the first precursor is a liquid at a temperature of from about 20° C. to about 100° C.

24. The method of claim 22 wherein the first precursor is vaporized at a temperature of from about 25° C. to about 150° C.

25. The method of claim 22 wherein the first precursor exhibits a vapor pressure of at least about 0.1 Torr at a temperature of from about 25° C. to about 150° C.

26. The method of claim 22 wherein the first precursor exhibits a chemisorption rate of at least about 0.5 monolayers per second at $10^{-4}$ Torr with a solid surface comprising an oxide having hydroxyl groups on the oxide surface, platinum, rhodium, iridium, titanium, TiN, TaN, TaSiN, TiBN, or silicon.

27. The method of claim 22 wherein the first precursor is non-pyrophoric.

28. The method of claim 22 wherein the first precursor comprises a single species and is optionally mixed with a non-reactive carrier gas.

29. An atomic layer deposition method comprising:
chemisorbing a monolayer of a first precursor on a substrate at a temperature of from about 100° C. to about 400° C. in the substantial absence of a second precursor, the first precursor consisting essentially of $Al(N(CH_3)_2)_2(N(CH_3)CH_2CH_2N(CH_3)_2)$ and the substrate comprising at least one of metal oxide, platinum, titanium, and TiN;
purging the first precursor from the over the substrate;
reacting a monolayer of the second precursor with the first chemisorbed precursor, the second precursor comprising at least one of a nitrogen source and an oxidant, and a reaction product of the first and second precursors comprising at least one of AlN or $Al_2O_3$;
purging the second precursor from the over the substrate; and
successively repeating exposure and purging of the first and second precursors to form a capacitor dielectric layer.

* * * * *